United States Patent [19]

Teskey

[11] Patent Number: 5,020,140
[45] Date of Patent: May 28, 1991

[54] THREE DIGIT CHANNEL ENTRY SYSTEM

[75] Inventor: John F. Teskey, Greenfield, Ind.

[73] Assignee: RCA Licensing Corporation, Princeton, N.J.

[21] Appl. No.: 489,391

[22] Filed: Mar. 5, 1990

[51] Int. Cl.$^5$ .......................... H04N 5/44; H04B 11/00
[52] U.S. Cl. .................................. 455/151; 358/194.1; 455/603
[58] Field of Search ...................... 358/194.1; 455/151, 455/352, 353, 603

[56] References Cited

U.S. PATENT DOCUMENTS

| | | | |
|---|---|---|---|
| 3,943,451 | 3/1976 | Stoddard | 325/464 |
| 4,162,513 | 7/1979 | Beyers, Jr. et al. | 358/191 |
| 4,386,436 | 5/1983 | Kocher et al. | 455/151 |

OTHER PUBLICATIONS

The User Manual for the MBC 300 Multi-Brand Remote Control, printed 1989.

*Primary Examiner*—Tommy P. Chin
*Attorney, Agent, or Firm*—Joseph S. Tripoli; Peter M. Emanuel; Thomas F. Lenihan

[57] ABSTRACT

A channel number data entry system for a television receiver employing a numeric keyboard allows the selection of cable channels having channel numbers greater than 99, without the use of a separate ENTER or 100s key. Specifically, if a predetermined unused or invalid channel number, such as 00, is entered, then the on-screen display message 1_is generated, and a three digit channel entry mode is enabled. If a valid and used two digit channel number is entered, then a two digit channel entry mode is enabled. In both modes, the desired channel is tuned upon receipt of the final digit of the channel number.

9 Claims, 3 Drawing Sheets

THREE DIGIT CHANNEL ENTRY SYSTEM

CROSS REFERENCE TO A RELATED APPLICATION

The subject application Ser. No. 489,392, filed Mar. 5, 1990, is related to a copending U.S. patent application bearing attorney's docket number RCA 85,631, and assigned to the same assignee as the present invention.

FIELD OF THE INVENTION

The subject application concerns the field of television receivers having channel selection capability including direct entry of digits.

BACKGROUND OF THE INVENTION

Broadcast television channels in the United States are assigned channel numbers between 2 and 83, inclusive. Until recently the cable television channel numbering system differed from the broadcast television channel numbering system, in that cable television channels were numbered from 2 to 99. Despite this difference, all broadcast television channels and cable television channels could be selected by entering, at most, two digits via a keyboard, mounted on the television receiver itself, or on a remote control unit. This limit of two digits per channel number has allowed the development of television receivers in which the tuner is controlled to select the desired channel immediately upon receiving the second digit of the channel number. The RCA CTC-140 color television receiver chassis, manufactured by Thomson Consumer Electronics, Inc., Indianapolis, Ind., is an example of such a system.

Recently in the United States, frequency space has been allocated for cable television channels which are numbered in excess of 99, thereby requiring a three-digit keyboard data entry system. The Electronics Industries Association (EIA) has recommended the following numbering system for cable channels.

| CABLE CHANNEL # | PICTURE CARRIER FREQUENCY | BAND |
| --- | --- | --- |
| 65–89 | 313.25 MHz–613.25 MHz | UHF |
| 90–94 | 619.25 MHz–643.25 MHz | UHF |
| 95–99 | (historically called A-1 to A-5) | Low VHF |
| 100–139 | 649.25 MHz–885.25 MHz | UHF |

Cable channel numbers 95 to 97 reside within the commercial FM radio broadcast band (88 MHz–108 MHz) in the United States, and are usually unused because of interference problems which may occur between the desired television signals and the undesired FM radio signals.

Two prior three-digit channel selection system are known. In the first of these known systems, the keyboard includes an ENTER key for signaling the completion of a channel number entry. Such a system is known from the MBC-300 remote control unit manufactured by Zenith Corporation. There are four disadvantages to this approach. First, viewers have become accustomed to the above-mentioned immediate reaction of the television receiver in tuning a channel upon receipt of the last digit entered by the viewer. This desirable feature is lost in a system which employs an ENTER key. Second, operation of the ENTER key undesirably adds a separate keystroke to the selection of all channels, requiring three keystrokes to select most channels, and four keystrokes to select channels greater than 99. Third, the cost and complexity of the keyboard, keycode encoding and keycode decoding is increased by the addition of the ENTER key. Fourth, it requires an additional key on keyboards which in recent years have become more and more crowded as new features have been added. For example, the keyboard of the RCA CRK-55 remote control unit includes 80 keys. Adding an ENTER key to such complex keyboards is undesirable, in that a user may have to search among all those keys for the additional ENTER key.

In the second of the known prior three-digit channel selection systems, a remote control unit includes a "100s" key. The operation of the 100s key enables a three digit channel number entry mode, by causing the entry of the digit 1 in the leftmost place of the three-digit channel number. Such a remote control unit is manufactured by Magnavox Corporation and bears model number UR111MX. This approach also exhibits the above-mentioned feature of an immediate reaction of the television receiver by tuning a channel upon receipt of the last digit entered by the viewer. However, it has the three other disadvantages discussed above with respect to the separate ENTER key.

SUMMARY OF THE INVENTION

It is herein recognized that it is desirable to provide a channel selection system for a television receiver which is capable of selecting channels having channel numbers greater than 99, which system does not require the use of either an ENTER key or a 100s key, and which will tune a channel corresponding to a desired two digit channel immediately upon entry of the second digit. According to the invention, a keyboard system having three-digit channel number data entry capability is responsive to the reception of an invalid or unused channel number for entering a mode in which cable channels greater than 99 may be tuned. If, however, a two digit channel number which is valid and used is received, then tuning is caused to occur immediately after the entry of the second digit of the channel number.

DETAILED DESCRIPTION OF THE EMBODIMENT

Figure 1:
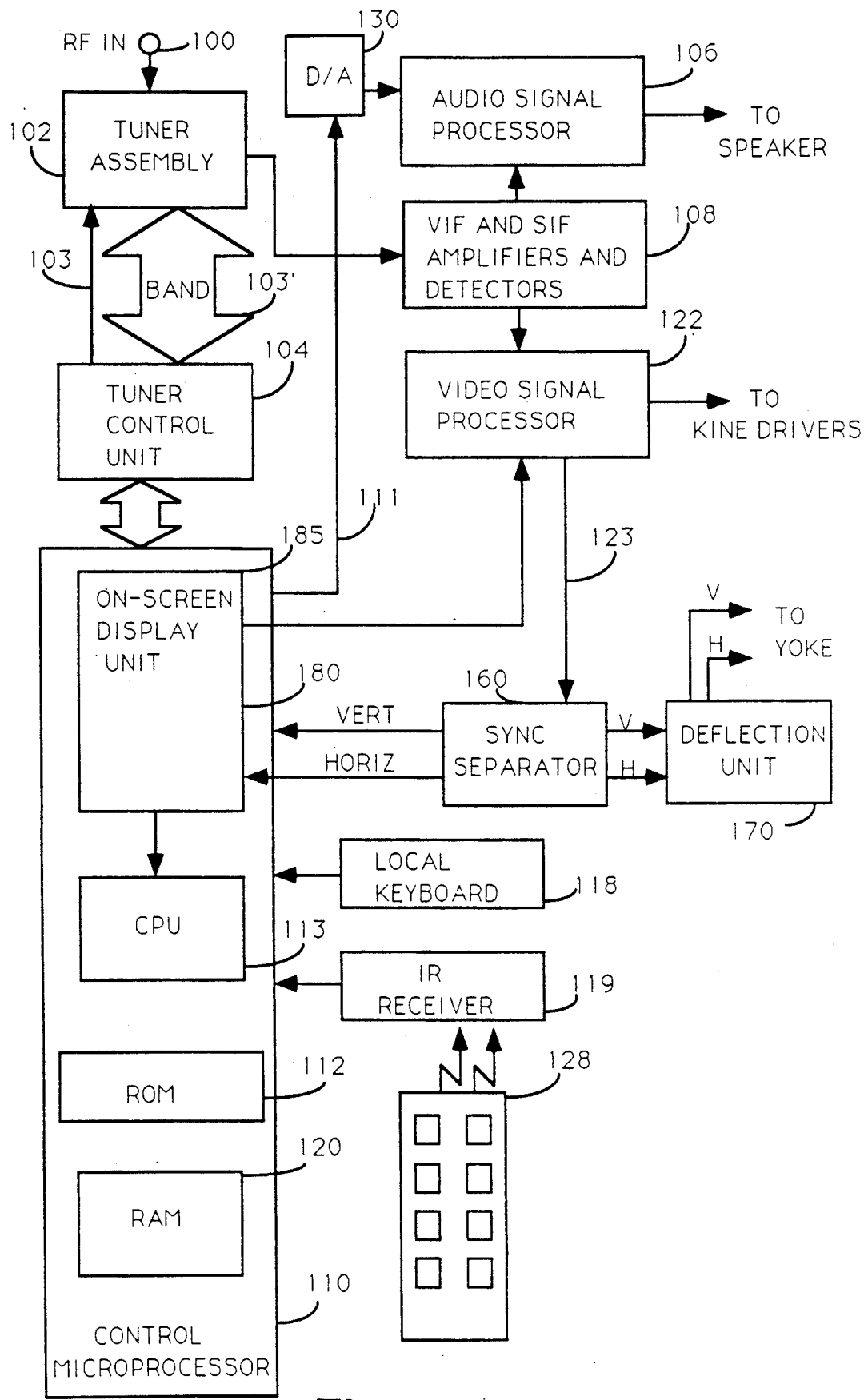
FIG. 1 shows, in block diagram form, an apparatus suitable for practicing the invention.

Referring to FIG. 1, a television receiver includes an RF input terminal 100 which receives radio frequency (RF) signals and applies them to a tuner assembly 102. Tuner assembly 102 selects and amplifies a particular RF signal under control of a tuner controller 104 which provides a tuning voltage via a wire 103, and band-switching signals via signal lines represented by the broad double-ended arrow 103'.

Tuner assembly 102 converts the received RF signal to an intermediate frequency (IF) signal and provides an IF output signal to video (VIF) and sound (SIF) amplifier and detector unit 108. VIF/SIF amplifier and detector unit 108 amplifies the IF signal applied to its input terminal and detects the video and audio information contained therein. The detected video information is applied as one input of a video processor unit 122. The detected audio signal is applied to an audio processor 106 for processing and amplification before being applied to a speaker (not shown).

Video signal processor 122 supplies a composite video signal to a sync separator unit 160 which produces vertical (V) and horizontal (H) synchronizing signals at respective outputs. The horizontal and vertical synchronizing signals are applied to a horizontal and vertical deflection unit 170 for generating scanning control signals for application to the yoke windings of a picture tube assembly (not shown).

Tuner controller 104 (which may be within control microcomputer 110) generates the tuning voltage and bandswitching signals in response to control signals applied from a system control microcomputer ($\mu$C) 110. The terms "microcomputer" and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from an infrared (IR) receiver 119 and from a "local" keyboard 118 mounted on the television receiver itself. IR receiver 119 receives IR transmissions from remote control transmitter 128. Microcomputer 110 includes a central processing unit (CPU) 113, a program memory (ROM) 112, and stores channel-related data in a random-access memory (RAM) 120. RAM 120 may be either internal to, or external to, microprocessor 110, and may be of either the volatile or non-volatile type. The term "RAM" is also intended to include electrically-erasable programmable read only memory (EEPROM). One skilled in the art will recognize that if volatile memory is utilized, that it may be desirable to use a suitable form of standby power to preserve its contents when the receiver is turned off.

Microprocessor 110 may also include an on-screen display unit (OSD) 185 for generating auxiliary signals suitable for displaying indicia, such as characters, for display on the display screen of the picture tube. Alternatively, on-screen display unit 185 may be external to microprocessor 110.

The television receiver described thus far is known from the RCA CTC-140 color television receiver manufactured by Thomson Consumer Electronics, Inc., Indianapolis, Ind.

Figure 2:
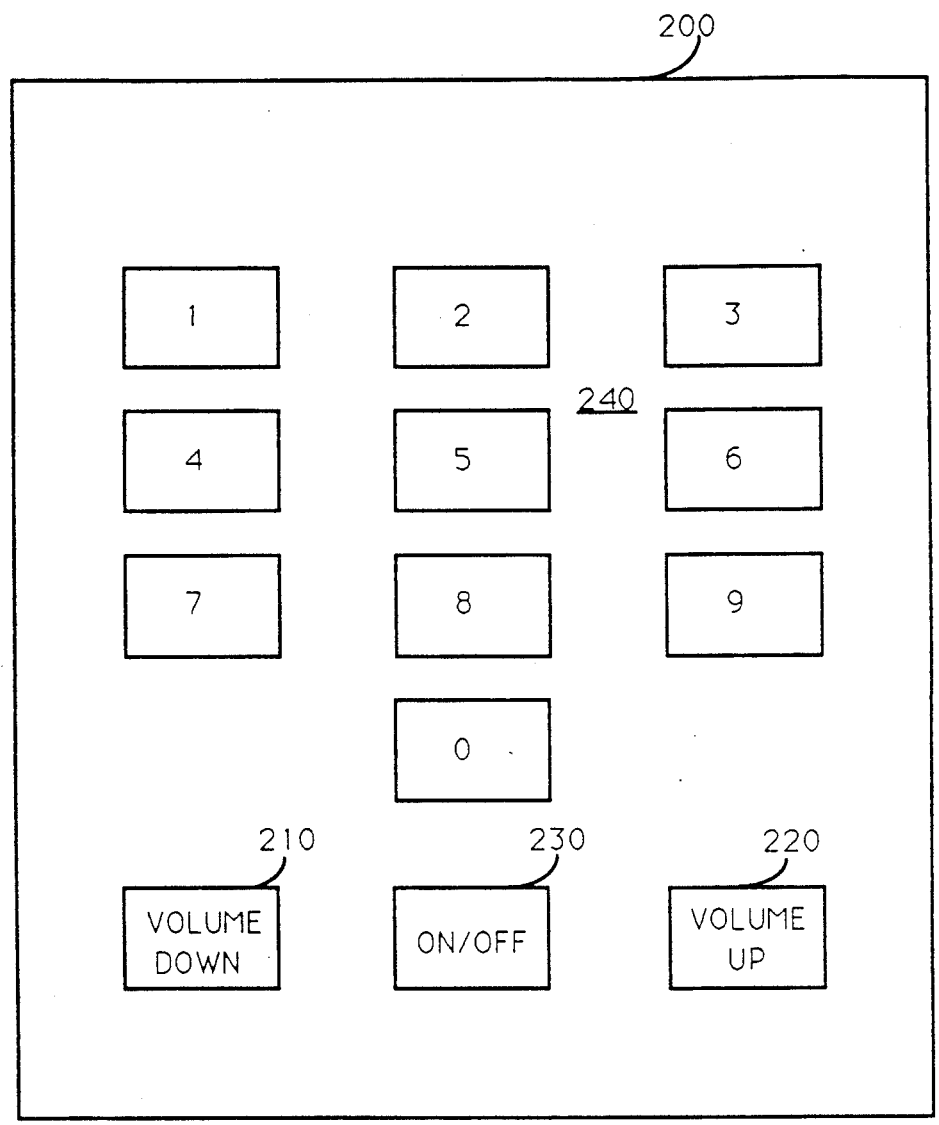
FIG. 2 shows the keyboard of a remote control unit suitable for use with the invention.

Keyboard 200 of FIG. 2 includes a VOLUME DOWN key 210, a VOLUME UP key 220, an ON/-OFF key 230, and a 0-9 numeric keypad, generally designated 240, for entering numeric data, such as channel number.

The present invention is directed to a channel number data entry system for a television receiver employing a numeric keyboard, which system allows the selection of cable channels having channel numbers greater than 99, without the use of a separate ENTER or 100s key. Specifically, if a predetermined unused or invalid two digit channel number, such as 00, is entered, then the on-screen display message $1_{13}$_is generated, and a three digit channel entry mode is enabled. Another invalid channel number in the United States is channel 01. As noted above, cable channel numbers 95 to 97 are unused for television because they reside in the commercial broadcast FM radio band. If a valid and used two digit channel number is entered, then a two digit channel entry mode is enabled. In both modes, the desired channel is tuned upon receipt of the final digit of the channel number.

Figure 3:
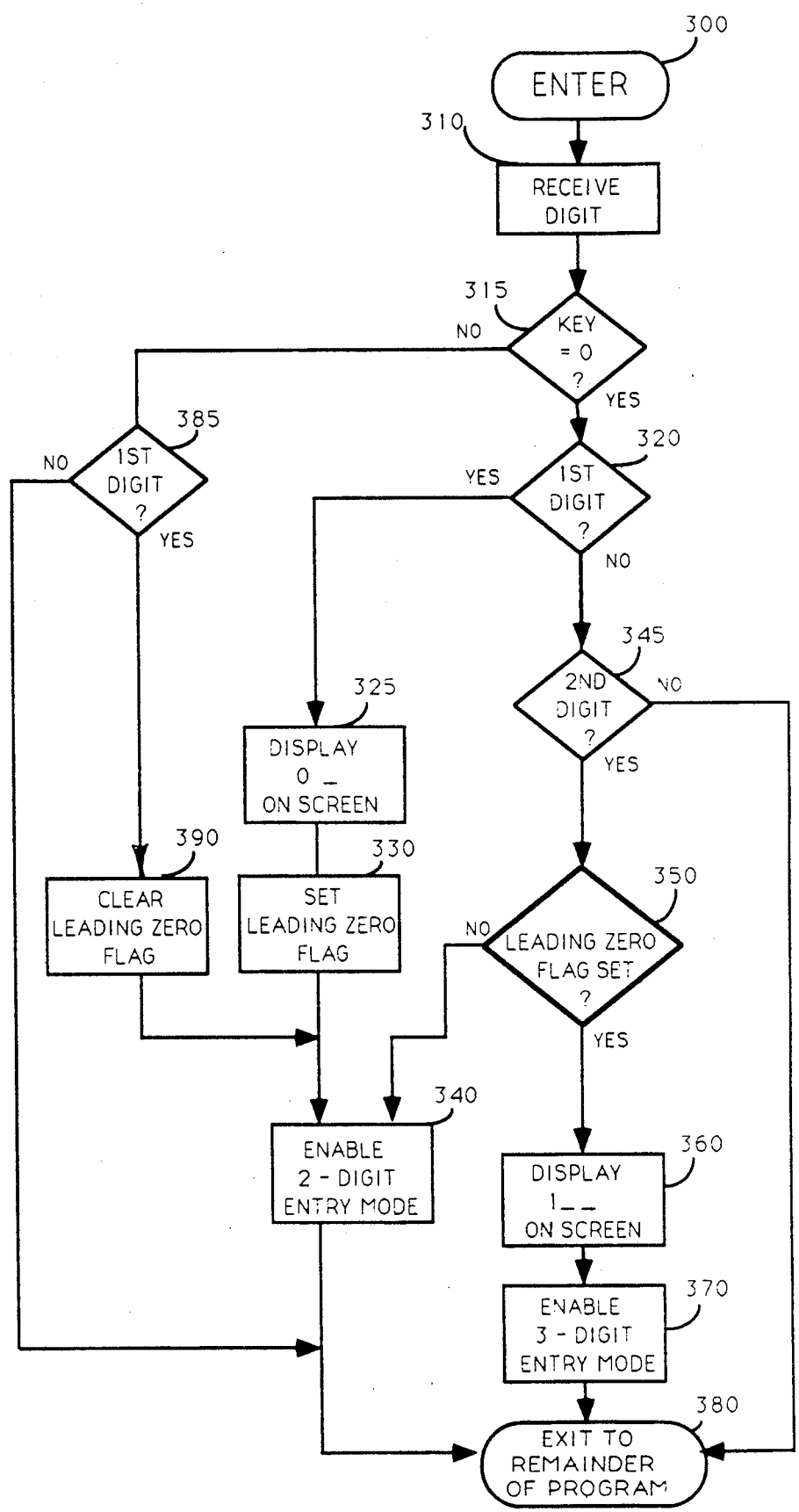
FIG. 3 is a flowchart showing a portion of the control program of the controller of FIG. 1.

The flowchart of FIG. 3 shows a portion of the keyboard decoding routine of the control program of microprocessor 110. The purpose of the portion of the routine shown in FIG. 3 is to detect the unique two digit code which causes the enabling of the three digit channel entry mode. The usual keycode decoding and display functions are performed in another portion of the keyboard decoding routine of the control program of microprocessor 110. The keycode decoding and display functions are not shown in FIG. 3 because they are known per se and need not be described here.

The routine of FIG. 3 is executed each time a keycode is received. The routine is entered at step 300 and receives a digit from IR receiver 119, or from local keyboard 118, at step 310. At step 315, a check is made to determine if the received digit corresponds to the numeral 0. If so, then the program advances to step 320, at which a check is made to see if this digit is the first digit received of a multidigit channel number. In the subject system, channel numbers less than 10 are entered beginning with a leading zero. That is, channel 9 is entered as 09. Therefore, if the first digit received is the numeral 0, then the yes path is taken from step 320 to step 325. At step 325, the message 0_is caused to be displayed on the display screen. That is, if the first digit received is the numeral 0, the received digit may be either the leading zero of a two digit channel number less than 10, or the leading zero of the code 00 which enables the three digit channel number entry mode.

At step 330, a data bit in a memory location, called the leading zero flag, is set. The program then advances to step 340 wherein the 2-digit channel number entry mode is enabled. At step 380, the program exits to the remainder of the keyboard decoding routines.

If, at step 320, the current digit is not the first digit received, then the no path is taken to step 345. At step 345, a check is made to see if the current digit is the second digit received. If not, it must be the third digit received, and the program must already be in the three digit channel entry mode. Accordingly, if the current digit is not the second digit, the no path is taken from step 345, and the routine is exited. If the current digit is the second digit received, then the yes path is taken to step 350, at which point the state of the leading zero flag is checked. If the second digit is the numeral 0, but the first digit was not the numeral zero (for example, channel number 10), then the no path will be taken from step 350 to step 340, and the two digit cable channel selection mode will be enabled. If, however, the currently received digit is the numeral 0, and the leading zero flag is set (indicating that the first digit received was also the numeral 0), then the program advances to step 360 at which the message 1__caused to be displayed, and the 3-digit channel number entry mode is enabled at step 370. The program is then exited at step 380 to the remainder of the keyboard decoding routines, known per se.

Step 385 is reached directly from step 315 for all digits received which are other than the numeral 0. If the current non-zero digit is not the first digit received, it should have no effect upon the state of the leading zero flag. In that case, the no path is taken from step 385 to the exit at step 380. If, however, the current nonzero digit is the first digit received, then it cannot form part of the special code 00 which triggers entry into the three digit channel entry mode. In that case, the yes path is taken from step 385 to step 390 at which the leading zero flag is cleared, the two digit channel entry mode is then enabled (step 340), and the routine is exited. As noted above, the remainder of the keyboard decoding routines (not shown) accessed via step 380 provide for the display of the entered digits on the display screen in a known manner via the OSD circuitry.

When a user wishes to enter the cable channel number 135, apparatus in accordance with the subject invention performs as follows. The user would enter the unique code 00 in order to enable the three digit channel entry mode. The OSD circuitry would cause the display of 0_in response to the entering of the leading zero by the user. The display would then change to 1_in response to the entering of the second zero. The display would show 1 3_in response to the entering of the digit 3, and 1 3 5 in response to the entering of the last digit. Immediately after receiving the final digit of the three digit channel number, in this example the numeral 5, control microprocessor 110 causes tuner assembly 102 to tune to cable channel 135.

It is herein recognized that the addition of an ENTER key or 100s key to keyboard of the remote control unit may require the modification of the control program of both the remote control unit (to detect, process and transmit the new keycode), and the control program of the controller in the television receiver (to receive, decode and process the new keycode).

The subject channel number data entry system described above avoids the necessity of modifying the control program of the remote control unit, because the invention resides in the television receiver and not in the remote control unit. As a result of the fact that no modification of the remote control unit is necessary, existing remote control units may be used when practicing the invention.

Further advantages of the present invention are that keyboard complexity is not increased, the cost of adding the additional key is saved, and the cost modifying the control program of the remote control unit is saved.

The term consumer electronic equipment, as used herein, includes television receivers and radios. The term television receiver, as used herein, includes television receivers having a display device (commonly known as television sets) and television receivers without a display device, such as VCRs.

It should be noted that while the code 00 was used in the above-described embodiment, any invalid or unused two digit channel number may be used to cause entry into the three digit channel entry mode, if the code detection routine of FIG. 3 is modified accordingly.

What is claimed is:

1. Channel selection apparatus for a television receiver, comprising:
    keyboard means including a plurality of keys for generating digits of two and three digit channel numbers when said keys are activated by a user;
    control means coupled to said keyboard means for receiving said digits and for generating a tuning control signal in response thereto;
    said control means operating in a first mode to generate said tuning control signal upon receiving the second digit of one of said two digit channel numbers, and operating in a second mode to generate said tuning control signal upon receiving the third digit of one of said three digit channel numbers;
    said control means detecting the generation of one of a two digit invalid channel number and a two digit unused channel number, and operating in said second mode in response thereto.

2. Channel selection apparatus for a television receiver, comprising:
    keyboard means including a plurality of keys for generating digits of two and three digit channel numbers when said keys are activated by a user;
    control means coupled to said keyboard means for receiving said digits and for generating a tuning control signal in response thereto;
    said control means operating in a first mode to generate said tuning control signal upon receiving the second digit of one of said two digit channel numbers, and operating in a second mode to generate said tuning control signal upon receiving the third digit of one of said three digit channel numbers;
    said control means detecting the sequential generation of the digits 00 and operating in said second mode in response thereto.

3. The apparatus of claim 2 further comprising:
    means, coupled to said control means, for generating character signals suitable for display on a display screen, said control means causing said character generating means to generate a character signal corresponding to the numeral 1 in response to the detection of said sequential generation of the digits 00.

4. Channel selection apparatus for a television receiver, comprising:
    keyboard means including a plurality of keys for generating digits of two and three digit channel numbers when said keys are activated by a user;
    control means coupled to said keyboard means for receiving said digits and for generating a tuning control signal in response thereto; and
    said control means operating in a first mode to generate said tuning control signal upon receiving the second digit of one of said two digit channel numbers, and operating in a second mode to generate said tuning control signal upon receiving the third digit of one of said three digit channel numbers;
    said control means detecting the sequential generation of two predetermined digits, and operating in said second mode in response thereto.

5. The apparatus of claim 4 wherein said two predetermined digits correspond to an invalid channel number.

6. The apparatus of claim 5 wherein said invalid channel number is channel number 00.

7. The apparatus of claim 4 wherein said two predetermined digits correspond to an unused channel number.

8. The apparatus of claim 4, further comprising:
    means, coupled to said control means, for generating character signals suitable for display on a display screen, said control means causing said character generating means to generate a character signal corresponding to the numeral 1 in response to the detection of said two predetermined digits.

9. Channel selection apparatus for a television receiver, comprising:
    keyboard means including a plurality of keys for generating digits of two and three digit channel numbers when said keys are activated by a user;

control means coupled to said keyboard means for receiving said digits and for generating a tuning control signal in response thereto;

said control means operating in a first mode to generate said tuning control signal upon receiving the second digit of one of said two digit channel numbers, and operating in a second mode to generate said tuning control signal upon receiving the third digit of one of said three digit channel numbers;

said control means detecting the generation of one of an invalid channel number and an unused channel number, and operating in said second mode in response thereto; and means, coupled to said control means, for generating character signals suitable for display on a display screen, said control means causing said character generating means to generate a character signal corresponding to the numeral 1 in response to the detection of said one of an invalid channel number and an unused channel number.

* * * * *